(12) United States Patent
Liaw

(10) Patent No.: US 7,193,292 B2
(45) Date of Patent: Mar. 20, 2007

(54) FUSE STRUCTURE WITH CHARGE PROTECTION CIRCUIT

(75) Inventor: Jhon-jhy Liaw, Taipei County (TW)

(73) Assignee: Taiwan Semiconductor Manufacturing Co., Ltd, Hsin-Chu (TW)

( * ) Notice: Subject to any disclaimer, the term of this patent is extended or adjusted under 35 U.S.C. 154(b) by 140 days.

(21) Appl. No.: 11/001,056

(22) Filed: Dec. 2, 2004

(65) Prior Publication Data

US 2006/0118904 A1 Jun. 8, 2006

(51) Int. Cl.
*H01L 29/00* (2006.01)

(52) U.S. Cl. .................. 257/529; 257/355; 257/544; 257/E23.149

(58) Field of Classification Search ............. 257/529
See application file for complete search history.

(56) References Cited

U.S. PATENT DOCUMENTS

| 4,636,825 | A  | * | 1/1987 | Baynes ...................... 257/401 |
| 6,667,537 | B1 | * | 12/2003 | Koike et al. ................ 257/536 |
| 6,933,591 | B1 | * | 8/2005 | Sidhu et al. ................ 257/665 |
| 2003/0122200 | A1 | * | 7/2003 | Kamiya et al. ............. 257/379 |

* cited by examiner

*Primary Examiner*—Tu-Tu Ho
(74) *Attorney, Agent, or Firm*—Birch, Stewart, Kolasch & Birch, LLP

(57) ABSTRACT

A fuse structure for memory cell repair in a RAM device. The fuse structure includes a substrate, a fuse layer over an isolation region on the substrate, a charge protection circuit electrically connected to one side of the fuse layer, and two conductive layers overlying the substrate and electrically connected to the charge protection circuit and the other side of the fuse layer respectively.

25 Claims, 5 Drawing Sheets

FUSE STRUCTURE WITH CHARGE PROTECTION CIRCUIT

BACKGROUND

The present invention relates to fuse structures on Random Access Memory (RAM), and more particularly to fuse structures with charge protection circuits on Random Access Memory (RAM) devices.

Advances in semiconductor processing technologies, such as high-resolution photolithography and anisotropic plasma etching, are dramatically reducing the feature sizes of semiconductor devices and increasing the device packing density. As the density of the semiconductor devices increases and the number of discrete devices increases on the chip, the final product yield for many integrated circuit devices (chip yield) may decrease as well. For example, as dynamic random access memory (DRAM) in the semiconductor device becomes highly integrated, the size of memory cells on a DRAM chip is reduced. If one of the DRAM memory cells has a defect, which may be caused by random defects generated in the manufacturing process, the DRAM will not function properly and is determined to be defective.

There is, however, high possibility that only a small number of defective memory cells exist in a memory product. If all memory products with defective memory cells are discarded, the yield of final products will be very low. Recently, additional rows of memory cells, i.e. redundant memory cells, have been disposed in a RAM device along with the main memory cells. Fuse circuits are built between row or column decoders and main memory cell arrays, respectively. Upon detection of one or more defective cell(s) in the main memory cell array, the corresponding fuse circuit is broken from the memory cell array with defective memory cells. Conventionally, the fuse layer is formed as an extended part of a polysilicon or metal layer at the same time the conductively doped polysilicon or metal layer is patterned to form part of the semiconductor device, such as the FET gate electrodes or the local interconnects. Currently, lasers are used to routinely open connections, i.e. fuses, in RAM devices, such as in DRAM or SRAM devices, to disable defective rows of memory cells and to modify the address decoder so that spare rows of memory cells are connected instead.

SUMMARY

The object of the present invention is to prevent charge damage after a fuse in a RAM device is broken for memory array repair. To achieve the object, the present invention provides a fuse structure for a RAM device, which includes at least one protection circuit between the fuse layer and the conductive line connecting to a control circuit or a memory array to avoid laser damage during memory cell array repair.

A detailed description is given in the following with reference to the accompanying drawings.

BRIEF DESCRIPTION OF THE DRAWINGS

The present invention can be more fully understood by reading the subsequent detailed description and examples with references made to the accompanying drawings, wherein.

DESCRIPTION

In this specification, expressions such as "overlying the substrate", "above the layer", or "on the film" simply denote a relative positional relationship with respect to the surface of the base layer, regardless of the existence of intermediate layers. Accordingly, these expressions may indicate not only the direct contact of layers, but also, a non-contact state of one or more laminated layers.

Fuse structures of a RAM device can be extended polysilicon or metal layers of control circuits. However, as the gate oxide of control circuits is continuously reduced for high performance MOS, the conventional fuse design results in a reliability issue due to redundant circuit failure on a high gate oxide leakage or lower breakdown voltage between CMOS gates to the bulk substrate. The high energy laser injection for fuse breaking induces a charge phenomenon. Electrons or electron holes are generated due to use of laser injection to break the metal or polysilicon fuse and inter-metal dielectric oxide and damage the connecting gate oxide of a connected MOS.

To prevent charge damage to adjacent circuits caused by the laser breaking, the present invention provides fuse structures with charge protection circuits for a Random Access Memory (RAM) device.

Figure 1A:
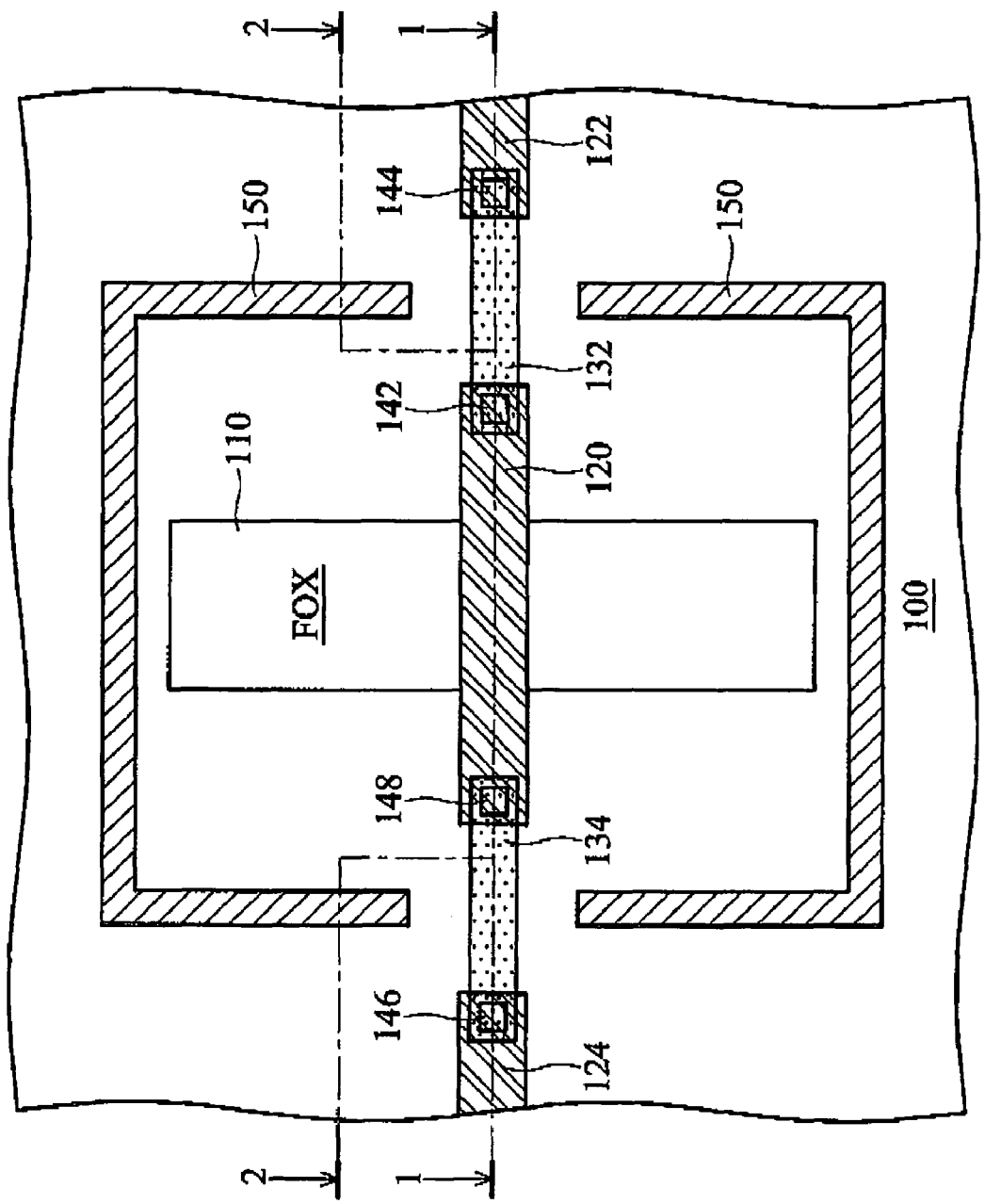
FIG. 1A is a top-view of a fuse structure of the invention.

FIG. 1A shows a top-view of a fuse structure of the invention. The fuse structure is designed to repair memory cell defects in a RAM device, e.g. a DRAM device. An isolation region, such as a field oxide layer (FOX) 110, is formed on a substrate 100, such as a p-type silicon substrate with a P_Well or an N_Well therein. The field oxide layer 110 can be a shallow trench isolation (STI) structure, a SOI structure, or a local oxidation structure (LOCOS). A fuse layer 120 is disposed over the field oxide layer 110. Both sides of the fuse layer 120 are electrically connected to two conductive layers 122 and 124, which can be connected to two control circuits (not shown) respectively, or a redundant memory cell array (not shown) and a control circuit (not shown) respectively. The fuse layer 120 and the two conductive layers 122 and 124, which can be metal or polysilicon layers formed simultaneously as a polysilicon gate layer, a first metal layer, an inter-metal layer or a top metal layer. Generally, when the fuse layer 120 is broken by laser, the control circuit will replace the defective memory cell array(s) with a redundant memory cell array.

To prevent charge damage during laser breaking, at least one charge protection circuit is formed between the fuse layer 120 and one of the conductive layers 122 and 124. One or two charge protection circuit(s) is/are disposed thereon depending on the control circuits or redundant control circuits connected by the conductive layers 122 and 124. If the control circuits or redundant circuits connected to the conductive layers 122 and 124 should still function after the fuse layer 120 is broken, charge protection circuits interconnecting the fuse layer 120 and the working conductive layers 122 and 124 should be disposed therebetween.

FIG. 1A shows two charge protection circuits 132 and 134 formed on the substrate 100 between the fuse layer 120 and the conductive layers 122 and 124 respectively. The charge protection circuits 132 and 134 can both be diodes, protection MOSs, or one diode and one protection MOS. Interconnects 142, 144, 146 and 148, connect the fuse layer 120, charge protection circuits 132 and 134, and conductive layers 122 and 124. A protection ring structure 150 is further disposed surrounding the fuse layer 120, which is an optional design feature to prevent thermal damage of surrounding circuits during fuse breaking by high energy laser.

Figure 1B:
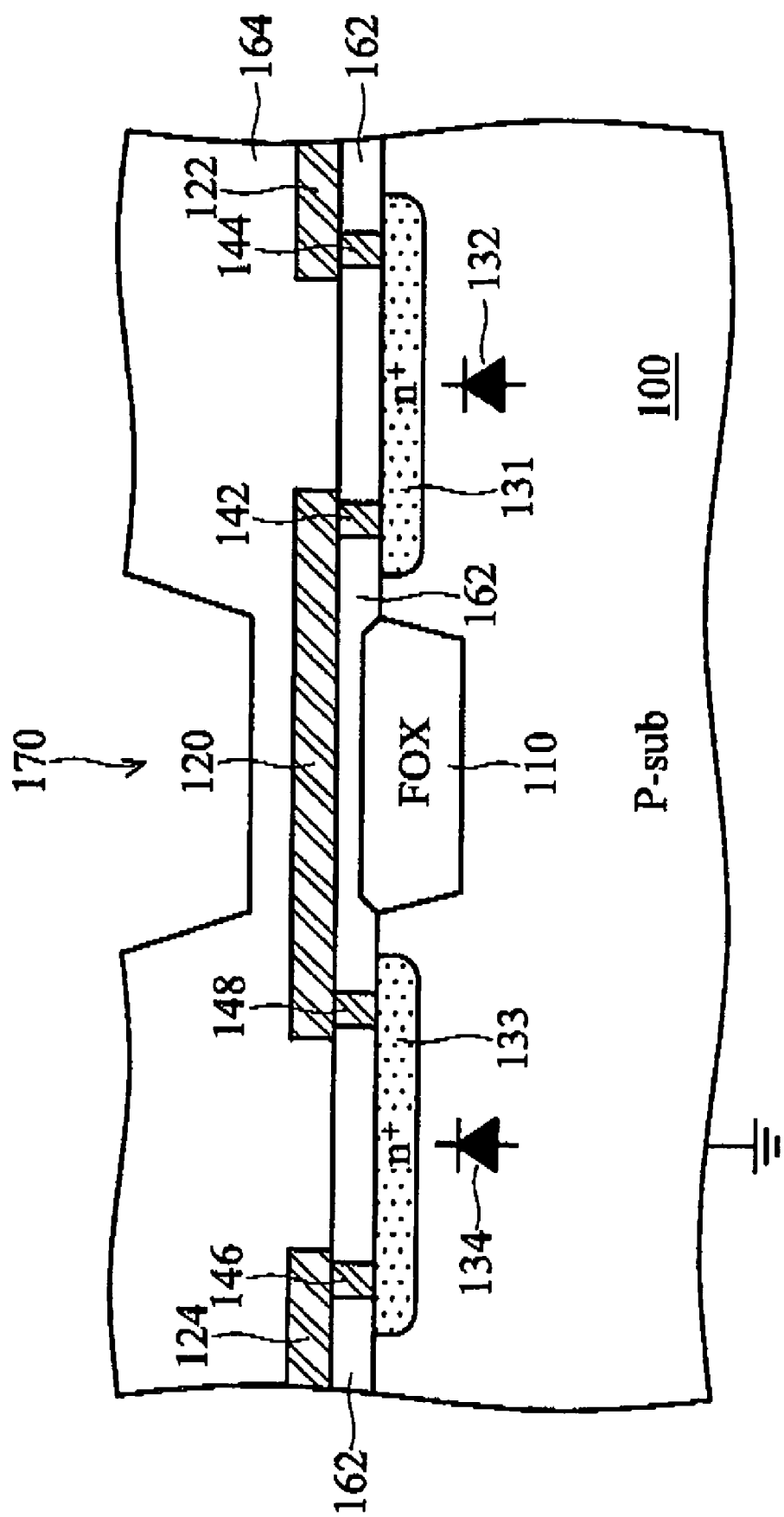
FIG. 1B is a cross section of FIG. 1A along line 1—1.

FIG. 1B is a cross section of FIG. 1A along line 1–1. A field oxide layer 110 is formed on the p-type silicon substrate 100 to define two active regions. The surface of the p-type silicon substrate 100 is covered with a dielectric layer 162, such as un-doped silica glass (USG) or a low-k dielectric material. The fuse layer 120 can be formed simultaneously with the two conductive layers 122 and 124 on the dielectric layer 162, which can be metal or polysilicon layers patterned to form part of a Random Access Memory device, such as FET gate electrodes or local interconnects.

As shown in FIG. 1B, two diodes 132 and 134 serving as charge protection circuits are formed between the fuse layer 120 and the conductive layers 122 and 124 respectively. The diodes 132 and 134 are composed of the p-type silicon substrate 100 or a P_Well region, and heavily n-doped regions 131 and 133 on the p-type silicon substrate 100 or the P_Well region on both sides of the fuse layer 120 respectively. The heavily n-doped regions can be n-doped silicon regions formed by implanting n-type dopants into the p-type substrate 100, n-doped polysilicon layers deposited on the surface of the p-type substrate 100, or n-doped silicon regions with silicide layers thereon. The fuse layer 120 is connected to the diodes 132 and 134 by contact or via plugs 142 and 148 respectively and the conductive layers 122 and 124 are connected to the diodes 132 and 134 by contact plugs 144 and 146 respectively. A dielectric layer 164 is disposed on the surface of the p-type silicon substrate 100, covering the fuse layer 120, the exposed dielectric layer 162 and the conductive layers 122 and 124. Preferably, the dielectric layer 164 right above the fuse layer 120 is etched to a certain depth to form a fuse window 170 to facilitate laser breaking.

Generally, the p-type substrate 100 is grounded when opening a fuse. Thus, as shown in FIG. 1B, when the fuse layer 120 is broken by laser, the electrons induced by the high energy laser are conducted to the grounded diodes 132 and 132, preventing charge damage of the connecting control circuits or redundant circuits via the conductive layers 122 and 124.

In another embodiment, not only diodes can serve as charge protection circuits, but also MOS structures. PMOSs can be the protection MOSs in an N-type substrate between the conductive layers 122 and 124 and the fuse layer 120. Similarly, NMOSs can be the protection MOSs in a P-type substrate.

Figure 2:
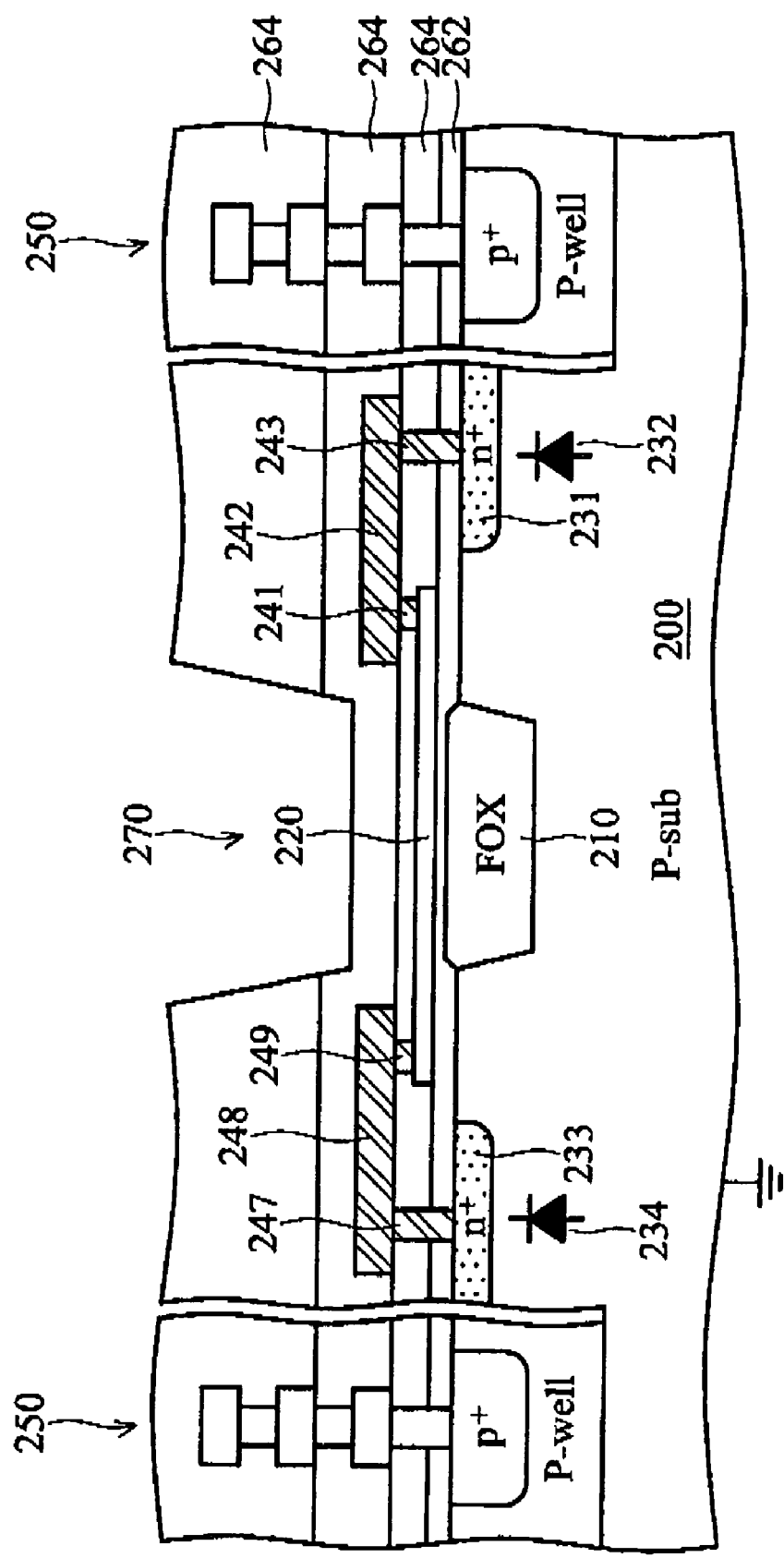
FIG. 2 is another cross section of FIG. 1A along line 2—2, showing a cross section of the protection ring and another interconnect type between the fuse layer and the diodes.

FIG. 2 is another cross section of FIG. 1A along line 2—2, showing a cross section of the protection ring and another interconnection between the fuse layer and the diodes. As shown in FIG. 2, the fuse layer 220 over the field oxide layer 210 is connected to the n-doped regions 231 and 233 of diodes 232 and 234 by two sets of interconnects, conductive plugs 241 and 243 with conductive line 242, and conductive plugs 247 and 249 with conductive line 248, respectively. The protection ring 250 surrounding the fuse layer 220 is composed of multi-layer interconnects connecting to the heavily p-doped region (p+) on p-well regions of the p-type substrate 200. The fuse layer as shown in FIG. 2 is preferably a polysilicon layer serving as a poly-fuse. The surface of the p-type substrate, including the fuse layer 220, interconnects 242, 248 and 250, are all covered with laminated dielectric layers 262 and 264. A fuse window 270 is formed above the fuse layer 220, as shown in FIG. 2.

Figure 3:
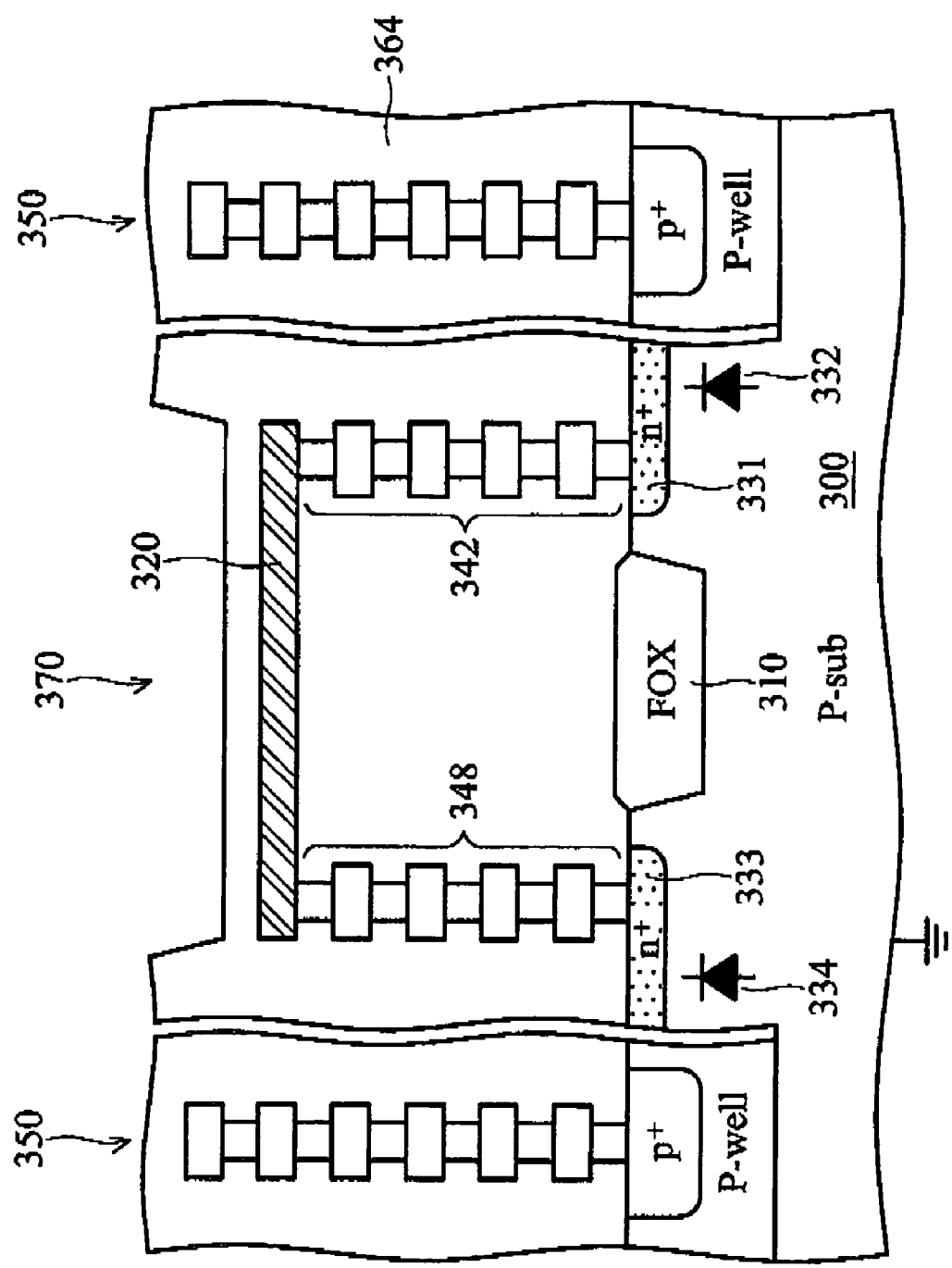
FIG. 3 is yet another cross section of FIG. 1A along line 2—2, showing a cross section of another type of the protection ring and interconnect between the fuse layer and the diodes.

FIG. 3 is another cross section of FIG. 1A along line 2—2, showing a cross section of the protection ring and another interconnection between the fuse layer and the diodes. The fuse layer 320 shown in FIG. 3 is connected to the n-doped regions 331 and 333 of diodes 332 and 334 by two sets of multi-layer interconnects 342 and 348, respectively. The multi-layer interconnects 342 and 348 can be composed of multiple metal lines and contact/via plugs. The protection ring 350 surrounding the fuse layer 320 is composed of multi-layer interconnects connecting the heavily p-doped region (p+) on p-well regions of the p-type substrate 200. The surface of the p-type substrate, including the fuse layer 320, interconnects 342, 348 and 350, are all covered with laminated dielectric layer 364. A fuse window 370 is formed above the fuse layer 320. The fuse layer 320 can be formed simultaneously with the first metal layer, or an inter-metals layer, or a top metal layer. The fuse layer material can be Al, Cu, TiN, TaN, Al containing metals, Cu containing metals, Ti containing metals, Ta containing metals, or the combination thereof. The interconnects 342 and 348 can be composed of landing metals, via plugs and contact plugs.

Although FIGS. 1A, 1B, 2 and 3 are illustrated with a p-type silicon substrate, the present invention is also applicable to an n-type silicon substrate with diodes as charge protection circuits between a fuse layer and the connecting conductive layers, wherein the diodes are composed of the n-type substrate and p-doped regions on the n-type substrate.

Figure 4:
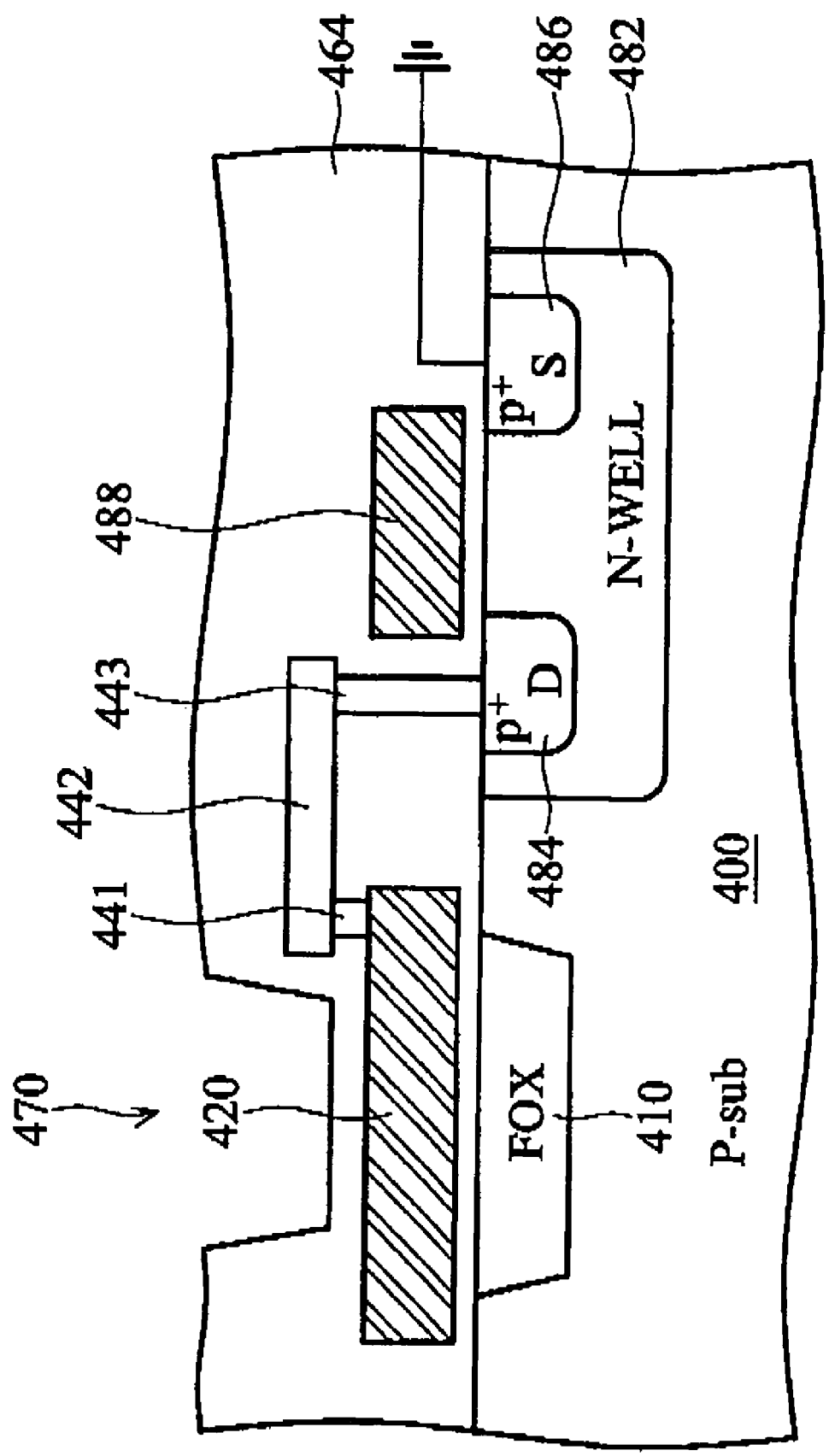
FIG. 4 is a cross section of a fuse structure with a MOS structure as a charge protection circuit of the invention.

In addition to using diode structures as protection circuits, MOS, i.e. MOSFET, structures can also be used as charge protection circuits of fuse structures in a RAM device. FIG. 4 shows an approach to utilize a MOS structure as charge protection circuit for a fuse layer of the invention. A fuse layer 420 is disposed over a field oxide layer 410 on a p-type silicon substrate 400. A pMOS is disposed on an N-well region 482 p-type silicon substrate 400 and on one side of the fuse layer 420 as a charge protection circuit between the fuse layer 420 and the connecting conductive layer (not shown), which is composed of a p-doped drain region (D) 484, a p-type source region (S) 486, and a gate structure 488. The p-doped drain region (D) 484 is connected to the fuse layer 420 with a drain electrode 443, a conductive line 442 and a fuse contact plug 441, and the p-type doped source region (S) 486 is grounded. When charge phenomenon is induced by fuse breaking, the current will flow to the drain region 484 and be driven to the grounded source region 486, thereby preventing charge damage.

Although FIG. 4 only illustrates a pMOS structure utilized in a p-type substrate with an N-well region as a charge protection structure for a fuse layer, an nMOS structure can also be utilized in an n-type substrate with a P-well region as a charge protection structure according to the same electric principle.

According to the present invention, charge protection circuits can be a diode on one side of the fuse layer and a MOS on the other side. In addition, charge protection circuits on opposite sides of the fuse layer can both be diodes or MOSs. The number of charge protection circuits disposed between the fuse layer and the conductive layers depends on the number of circuits requiring protection.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A fuse structure, comprising:
a substrate;
a fuse layer over an isolation region on the substrate;
a charge protection circuit electrically connected to one side of the fuse layer;
a first and second conductive layer overlying the substrate and electrically connected to the charge protection circuit and the other side of the fuse layer respectively;
a dielectric layer covering the fuse layer and the first and second conductive layer; and
a fuse window in the dielectric layer being directly above the fuse layer.

2. The fuse structure as claimed in claim 1, wherein the charge protection circuit is a diode.

3. The fuse structure as claimed in claim 2, wherein the substrate is a p-type silicon substrate and the diode is composed of the p-type silicon substrate and an n-doped silicon region on the p-type silicon substrate.

4. The fuse structure as claimed in claim 1, wherein the charge protection circuit is a protection MOS.

5. The fuse structure as claimed in claim 4, wherein the substrate is a p-type silicon substrate or a substrate with a P-well therein and the protection MOS is an NMOS disposed on the p-type substrate or in the P-well in the substrate with a therein, or the substrate is a p-type silicon substrate with an N-well therein and the protection MOS is a PMOS disposed in the N-well.

6. The fuse structure as claimed in claim 1, wherein the other side of the fuse layer is connected to the second conductive layer further via a second charge protection circuit.

7. The fuse structure as claimed in claim 6, wherein the second charge protection circuit is a diode.

8. The fuse structure as claimed in claim 6, wherein the substrate is a p-type silicon substrate and the diode is composed of the p-type silicon substrate and an n-doped silicon region in the p-type silicon substrate.

9. The fuse structure as claimed in claim 1, wherein the fuse layer is a polysilicon layer, a polysilicon layer with silicide thereon, or a metal layer.

10. The fuse structure as claimed in claim 9, wherein the first and second conductive layers comprise a polysilicon layer, a polysilicon layer with silicide thereon, a metal layer or the combination.

11. The fuse structure as claimed in claim 1, wherein the fuse layer is electrically connected to the second type doped region and the conductive layer by interconnects.

12. The fuse structure as claimed in claim 11, wherein the interconnects are multi-layer interconnects comprise interconnected multi-metal lines and conductive contact or via plugs.

13. The fuse structure as claimed in claim 1, wherein one of the first and second conductive layers is parallel connected to a redundant memory array.

14. A fuse structure, comprising:
a first conductivity type substrate;
a fuse layer over an isolation region on the first conductivity type substrate; a second conductivity type doped region on the first conductivity type substrate, being electrically connected to one side of the fuse layer;
a charge protection circuit electrically connected to an opposite side of the fuse layer;
a first and second conductive layer electrically connected to the second conductivity type doped region and the charge protection circuit respectively;
a redundant control circuit electrically connected to one of the first and second conductive layers;
a dielectric layer covering the fuse layer and the first and second conductive layer; and
a fuse window in the dielectric layer being directly above the fuse layer.

15. The fuse structure as claimed in claim 14, wherein the first conductivity type substrate is a p-type silicon substrate and the second conductivity type doped region is a heavily n-doped silicon region.

16. The fuse structure as claimed in claim 15, wherein the charge protection circuit is a diode composed of the p-type silicon substrate and another heavily n-doped silicon region on the p-type silicon substrate.

17. The fuse structure as claimed in claim 15, wherein the charge protection circuit is an NMOS disposed on the p-type substrate or a PMOS disposed on an N-well in the p-type silicon substrate.

18. The fuse structure as claimed in claim 14, wherein the fuse layer and the first and second conductive layers are, the same or different, polysilicon layers, polysilicon layers with silicide layers thereon, metal layers or the combination thereof.

19. The fuse structure as claimed in claim 14, wherein the fuse layer is electrically connected to the second type-doped region and the charge protection circuit by multi-layer interconnects.

20. A fuse structure, comprising:
a substrate;
a fuse layer over an isolation region on the substrate;
a first and second charge protection circuit electrically connected to two sides of the fuse layer respectively by two interconnects; and
a first and second conductive layer overlying the substrate and electrically connected to the first and second charge protection circuits respectively; and
a dielectric layer covering the fuse layer and the first and second conductive layer; and
a fuse window in the dielectric layer being directly above the fuse layer.

21. The fuse structure as claimed in claim 20, wherein the substrate is a first conductivity type-doped substrate and the first and second charge protection circuits are diodes, composed of two second conductivity type-doped regions on the first conductivity type substrate respectively, and the two sides of the fuse layer are electrically connected to the two second conductivity type-doped regions respectively.

22. The fuse structure as claimed in claim 20, wherein the first and second charge protection circuits are, the same or different, a diode or a protection MOS.

23. The fuse structure as claimed in claim 20, wherein the fuse layer comprises polysilicon, polysilicon covering with silicide, Cu, Al, Cu-containing metal, Al containing metal, TiN, TaN, or the combination thereof.

24. The fuse structure as claimed in claim 23, wherein the fuse layer is simultaneously formed with a gate layer, a first metal layer, an inter-metal layer, or a top metal layer.

25. The fuse structure as claimed in claim 20, wherein one of the first and second conductive layers is electrically connected to a redundant control circuit.

* * * * *